(12) United States Patent
Leobandung et al.

(10) Patent No.: US 9,577,096 B2
(45) Date of Patent: Feb. 21, 2017

(54) SALICIDE FORMATION ON REPLACEMENT METAL GATE FINFET DEVICES

(71) Applicant: International Business Machines Corporation, Armonk, NY (US)

(72) Inventors: Effendi Leobandung, Stormville, NY (US); Soon-Cheon Seo, Glenmont, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1 day.

(21) Appl. No.: 14/715,730

(22) Filed: May 19, 2015

(65) Prior Publication Data

US 2016/0343856 A1    Nov. 24, 2016

(51) Int. Cl.
| | |
|---|---|
| *H01L 29/78* | (2006.01) |
| *H01L 29/66* | (2006.01) |
| *H01L 29/417* | (2006.01) |
| *H01L 29/06* | (2006.01) |

(52) U.S. Cl.
CPC ....... *H01L 29/7845* (2013.01); *H01L 29/0649* (2013.01); *H01L 29/41783* (2013.01); *H01L 29/665* (2013.01); *H01L 29/6656* (2013.01); *H01L 29/66545* (2013.01); *H01L 29/66795* (2013.01); *H01L 29/785* (2013.01)

(58) Field of Classification Search
CPC ........... H01L 29/7845; H01L 29/66545; H01L 29/6656; H01L 29/665; H01L 29/66795; H01L 29/41783; H01L 29/0649

USPC .......................................................... 257/401
See application file for complete search history.

(56) References Cited

U.S. PATENT DOCUMENTS

| | | | |
|---|---|---|---|
| 5,166,096 A | 11/1992 | Cote et al. | |
| 6,306,712 B1 * | 10/2001 | Rodder | ............... H01L 21/2652 438/289 |
| 7,105,390 B2 | 9/2006 | Brask et al. | |
| 7,396,767 B2 | 7/2008 | Wu et al. | |
| 8,440,533 B2 | 5/2013 | Toh et al. | |
| 2013/0161744 A1 | 6/2013 | Basker et al. | |
| 2013/0193446 A1 | 8/2013 | Chao et al. | |

(Continued)

OTHER PUBLICATIONS

Besser et al., "Ni—Pt silicide formation through Ti mediating layers," Microelectronic Engineering, vol. 84, No. 11, 2007, pp. 2511-2516.

(Continued)

*Primary Examiner* — Hrayr A Sayadian
(74) *Attorney, Agent, or Firm* — Cantor Colburn LLP; Vazken Alexanian

(57) ABSTRACT

A fin field effect transistor (finFET) device and a method of fabricating a finFET are described. The method includes forming a replacement gate stack on a substrate between inside walls of sidewall spacers, epitaxially growing a raised source drain (RSD) on the substrate adjacent to outside walls of the sidewall spacers, and forming a silicide above the RSD and along the outside walls of the sidewall spacers. The method also includes depositing and polishing a contact metal above portions of the replacement gate stack and the RSD, the contact metal contacting the silicide along the outside walls of the sidewall spacers adjacent to the portions of the replacement gate stack.

12 Claims, 14 Drawing Sheets

(56) References Cited

U.S. PATENT DOCUMENTS

2013/0193502 A1  8/2013  Kocon et al.

OTHER PUBLICATIONS

Dixit et al., "Ion Metal Plasma (IMP) Deposited Titanium Liners for 0.25/0.18 um Multilevel Interconnections", International Electron Devices Meeting, IEDM'96, 1996, pp. 357-360.
McDEVITT et al., "Collimated Sputtering of Titanium Liner Films to Control Resistance of High Aspect-Ratio Contacts", Society of Photo-Optical Instrumentation Engineers (SPIE) Conference Series, vol. 1805, 1993, pp. 89.
Solomon et al., "Two Gates are Better Than One: A Planar Self-Aligned Double-Gate MOSFET Technology to Achieve the Best On/Off Switching Ratios as Gate Lenths Shrink", IEEE Circuits and Devices Magazine, vol. 19, No. 1, 2003, pp. 48-62.

\* cited by examiner

SALICIDE FORMATION ON REPLACEMENT METAL GATE FINFET DEVICES

BACKGROUND

The present invention relates to fin field effect transistor (finFET) devices, and more specifically, to silicide formation on replacement metal gate (RMG) finFET devices.

Salicide (self-aligned silicide) refers to the formation of electrical contacts between the semiconductor device (finFET) and supporting interconnect structure. Typically, a thin refractive metal film reacts with silicon in active regions of the device to form a metal silicide (metal silicon alloy), and does not react with other materials such as insulators. The contact is regarded as self-aligned because it does not require lithographic patterning. The silicide between the contact and the semiconductor material (specifically, the source-drain region) lowers the resistance.

SUMMARY

According to one embodiment of the present invention, a method of fabricating a fin field effect transistor (finFET) device includes forming a replacement gate stack on a substrate between inside walls of sidewall spacers; epitaxially growing a raised source drain (RSD) on the substrate adjacent to outside walls of the sidewall spacers; forming a silicide above the RSD and along the outside walls of the sidewall spacers; and depositing and polishing a contact metal above portions of the replacement gate stack and the RSD, the contact metal contacting the silicide along the outside walls of the sidewall spacers adjacent to the portions of the replacement gate stack.

According to another embodiment, fin field effect transistor (finFET) device includes a gate stack between inner walls of sidewall spacers formed on a substrate, the gate stack comprising a high-k dielectric and a gate metal; an epitaxially grown raised source drain (RSD) on the substrate, the RSD adjacent to outer walls of the sidewall spacers; a silicide on a surface of the RSD and along a surface of the outer walls of the sidewall spacers above the RSD; and a contact metal above portions of the gate stack and the RSD, the contact metal contacting the silicide along the outside walls of the sidewall spacers adjacent to the portions of the gate stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-12 illustrate cross-sectional views of intermediate structures involved in finFET fabrication, in which:

FIG. 1 shows an initial structure in a replacement gate process;

FIG. 2 shows the result of epitaxially growing the raised source drain (RSD) and depositing a liner on the resulting structure;

FIG. 3 is an intermediate structure resulting from the deposition of a flowable oxide over the liner;

FIG. 4 shows the result of opening up the gate region using a CMP process;

FIG. 5 illustrates the intermediate structure resulting from removal of the dummy gate stack;

FIG. 6 shows the structure including the gate metal;

FIG. 7 illustrates deposition of a dielectric cap over the gate metal;

FIG. 8 shows the result of polishing the dielectric cap material;

FIG. 9 illustrates the resulting structure when the flowable oxide is removed;

FIG. 10 shows deposition of an $HfO_2$ layer conformally over the liner;

FIG. 11 shows the structure that results from re-deposition of an oxide interlayer dielectric (ILD) followed by SAC RIE; and FIG. 12 is the structure that results from deposition of the contact metal and formation of silicide from the liner;

FIGS. 13 and 14 illustrate additional processes that are specific to the pFET region of the finFET device, in which:

FIG. 13 shows the structure that results from removal of the contact metal from the structure shown in FIG. 12, followed by deposition of a nickel-platinum alloy (NiPt); and FIG. 14 shows the structure in the pFET region resulting from re-deposition of the contact metal.

DETAILED DESCRIPTION

As noted above, silicide or a metal silicon alloy between the contact and the source-drain region of a finFET device acts to lower resistance. When the PC pitch is scaled beyond 64 nanometers (nm), a self-aligned contact (SAC) is needed to avoid potential gate (PC) to contact (CA) shorts. However, because of the limitation in overlay control at sub 64 nm contacted poly pitch (CPP), the contact may land partially at the top of the epitaxially grown raised source drain (RSD), causing a further reduced contact area even for a given pitch scaling. Embodiments of the systems and methods detailed herein relate to silicide formation that increases the conductivity path and thereby further reduces resistance when compared with conventional finFET fabrication. Specifically, a pseudo-silicide silicide process uses a metal (e.g., titanium (Ti)) liner to form a u-shaped silicide (the silicide is on the side of the gate as well as on top of the RSD. This extends the contact area toward the top of the gate as further discussed below (e.g., on the order of 5 times) and alleviates the contact resistance increase that occurs due to scaling.

Figure 1:
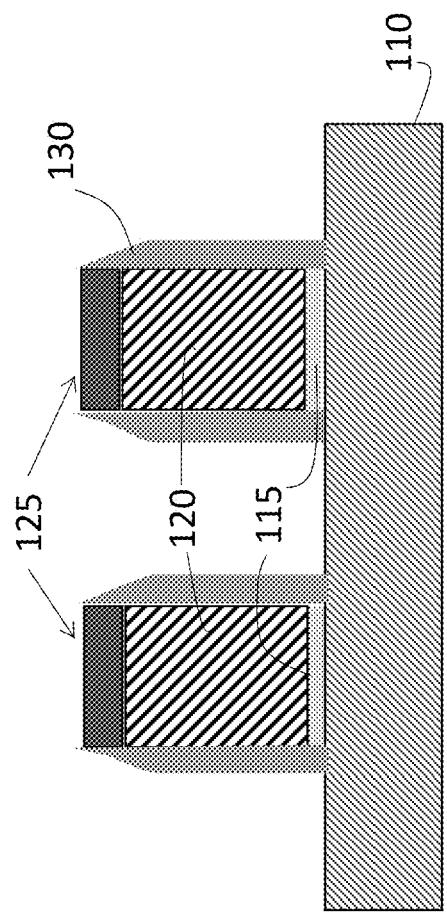
Figure 2:
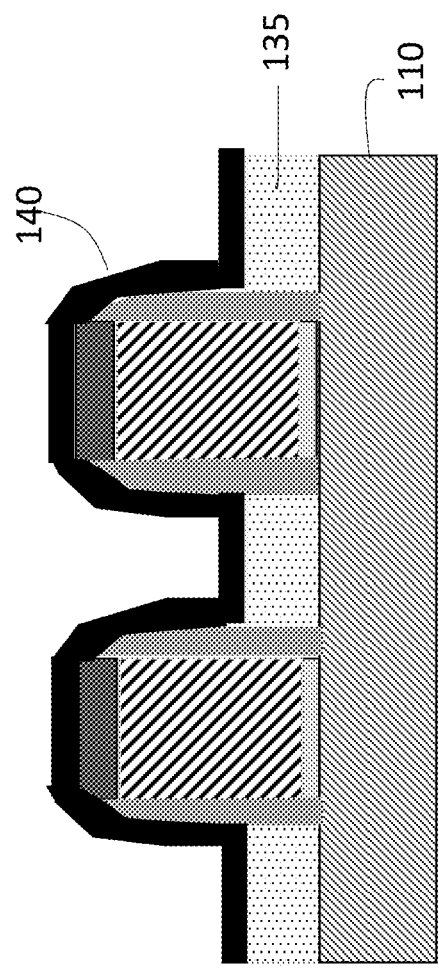
Figure 3:
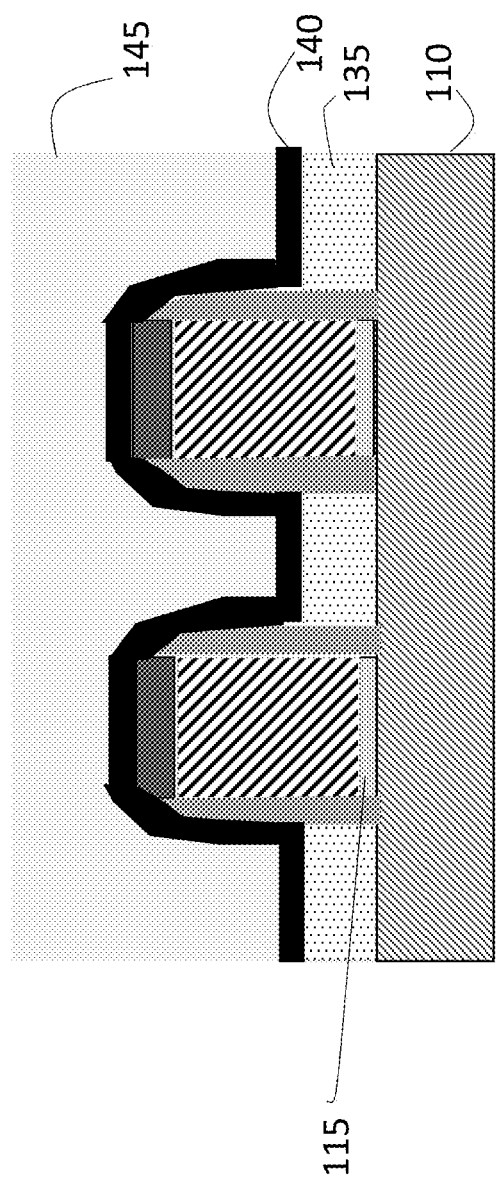
Figure 4:
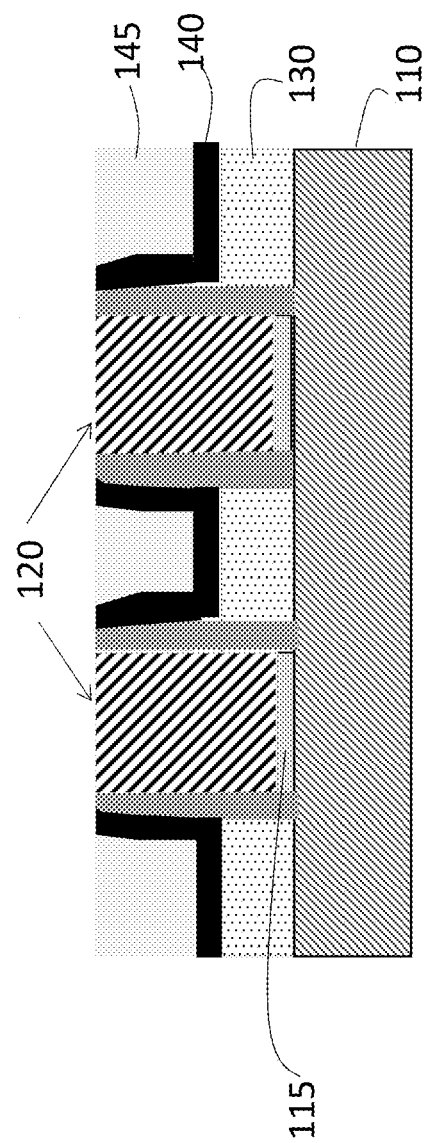

FIGS. 1-12 illustrate cross-sectional views of intermediate structures involved in the finFET fabrication. FIG. 1 illustrates an initial structure in the replacement gate process. A dummy gate stack comprising a dummy oxide 115, dummy gate 120, and hard mask 125 is patterned above a substrate 110. Sidewall spacers 130 are formed through a nitride spacer deposition (e.g., silicon nitride (SiN)) and reactive ion etch (RIE) process. The fin cap or dummy oxide 115 is deposited by molecular layer deposition (MLD) followed by deposition of silicon (dummy gate 120). FIG. 2 shows the result of completing two processes. A known process of epitaxially growing dual raised source drain (RSD) 135 is performed for fin merge. A liner 140 (e.g., Ti) is then conformally deposited, as shown in FIG. 2. This liner 140 may be 10 to 15 nanometers (nm) in thickness, for example, and serves as the material that forms a salicide, as described in further detail below (see e.g., FIG. 12). A flowable oxide 145 is deposited over the liner 140 to result in the structure shown in FIG. 3. A high density plasma (HDP) oxide and nitride may be deposited followed by a chemical mechanical planarization (CMP) to open up the gate region and result in the structure shown in FIG. 4. The nitride may be deposited using an in-situ radical assisted deposition (iRAD) tool, for example. The CMP process may be a known poly-open CMP process.

Figure 5:
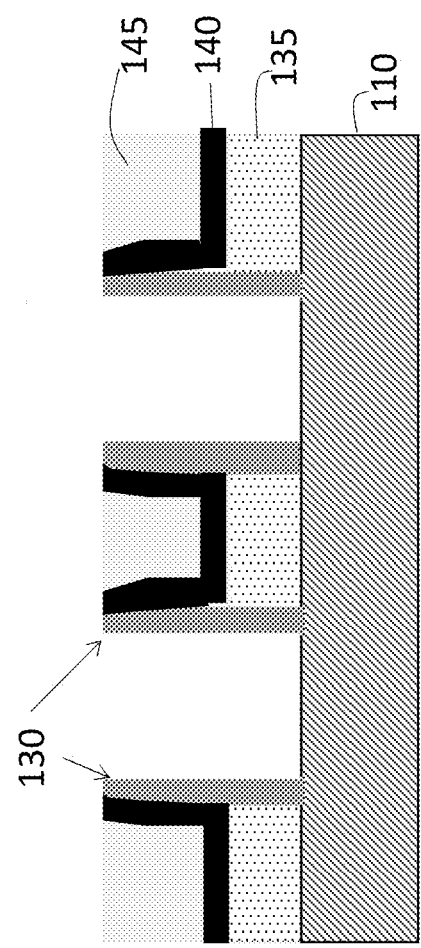
Figure 6:
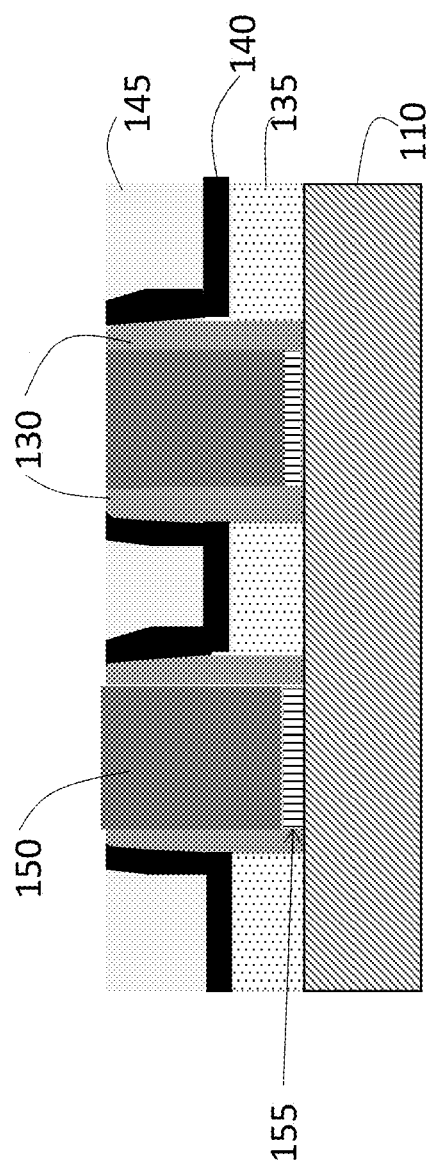
Figure 7:
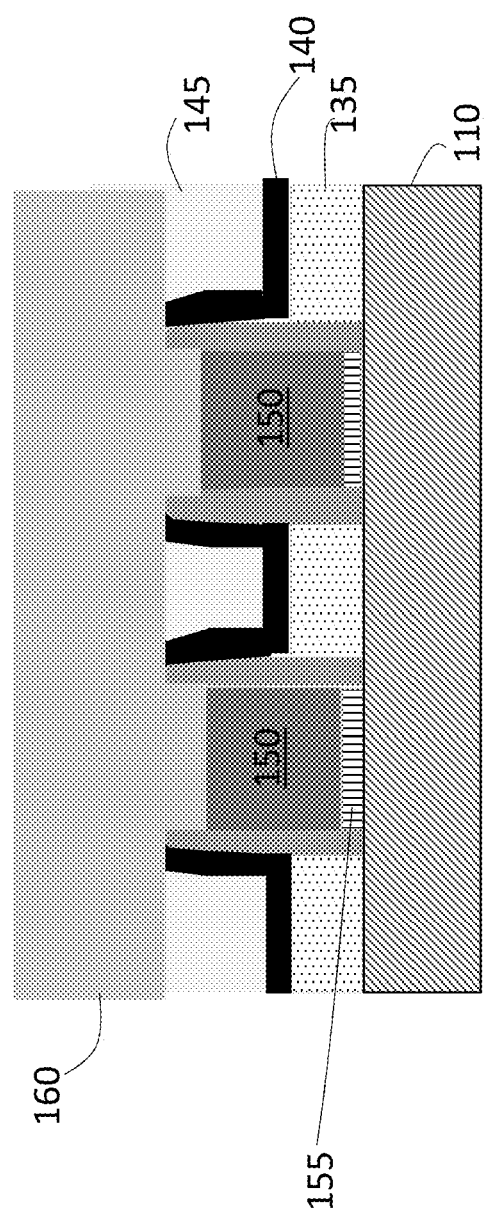
Figure 8:
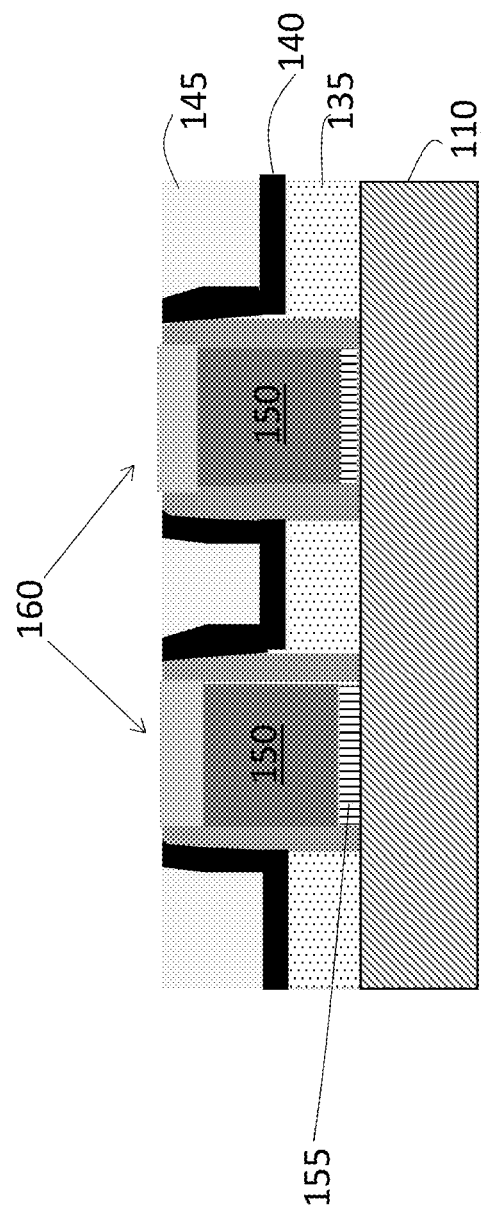
Figure 9:
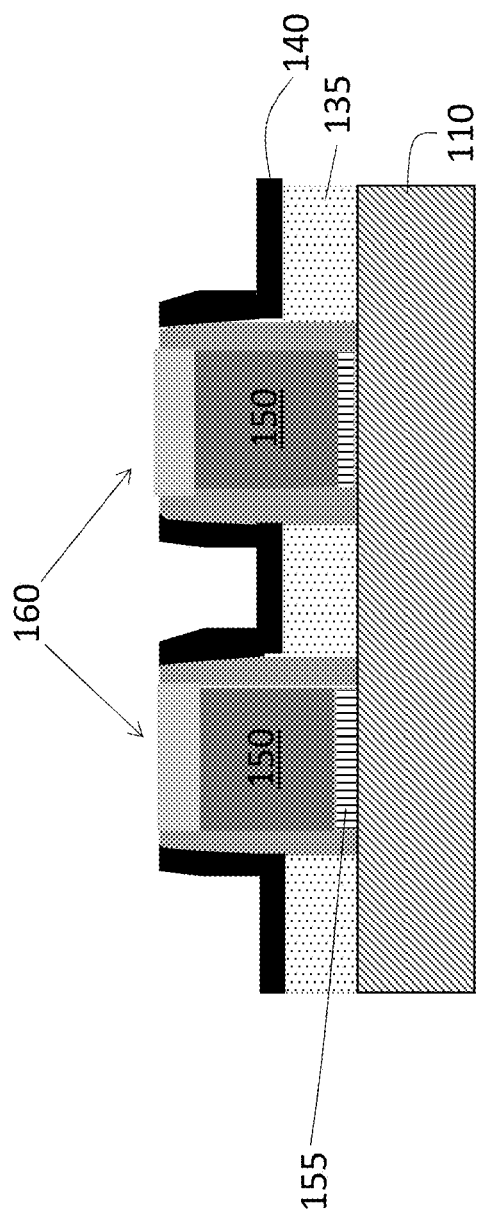
Figure 10:
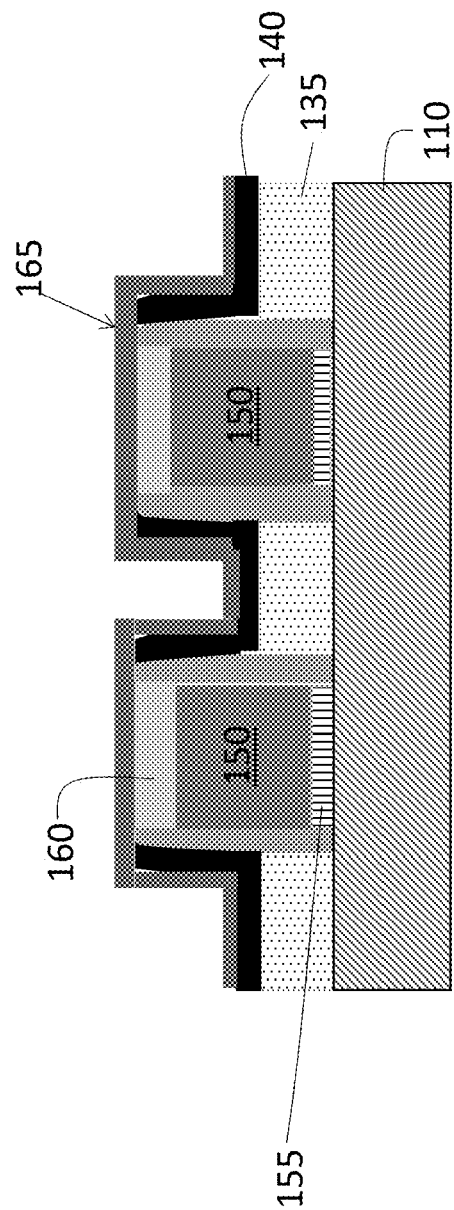

FIG. 5 illustrates the intermediate structure resulting from removal of the dummy gate stack (115, 120, 125). A poly-silicon RIE is performed to remove the dummy gate 120 followed by chemical oxide removal (COR) to remove the dummy oxide 115. A high-k preclean may then be performed. FIG. 6 shows the structure that results from a replacement metal gate fill process as known in the art, including the formation of an interfacial oxide layer (not specifically shown), the deposition of a high-k dielectric layer 155 (e.g., hafnium oxide ($HfO_2$)), one or more work-function metals and barrier layers (not specifically shown), and a gate metal layer 150 (e.g., tungsten W). The high-k dielectric layer 155 may alternately cover the sidewalls (inside of sidewall spacers 130), as well. As shown in FIG. 6, additional etch may be used to remove the high-k dielectric layer 155 from the sidewalls prior to deposition of the gate metal layer 150. The gate metal 150 is etched back and a cap material 160 (e.g., silicon nitride (SiN)) is deposited as shown in FIG. 7. The cap material 160 forms a dielectric cap for the self-aligned contact (SAC) process. The dielectric cap material 160 is then polished to result in the structure shown in FIG. 8. An oxide deglaze process is used to remove the flowable oxide 145 (the interlayer dielectric between the gates) and expose the Ti liner 140 to result in the structure shown in FIG. 9. An $HfO_2$ layer 165 is then deposited conformally over the liner 140 in the structure of FIG. 10 to act as a self-aligned contact etch stop layer.

Figure 11:
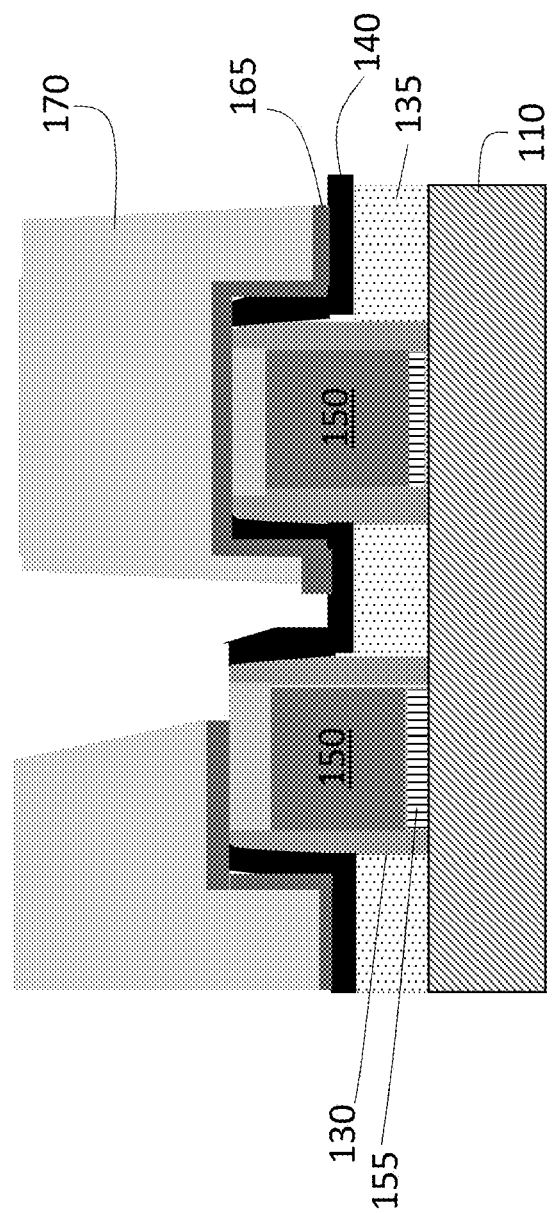
Figure 12:
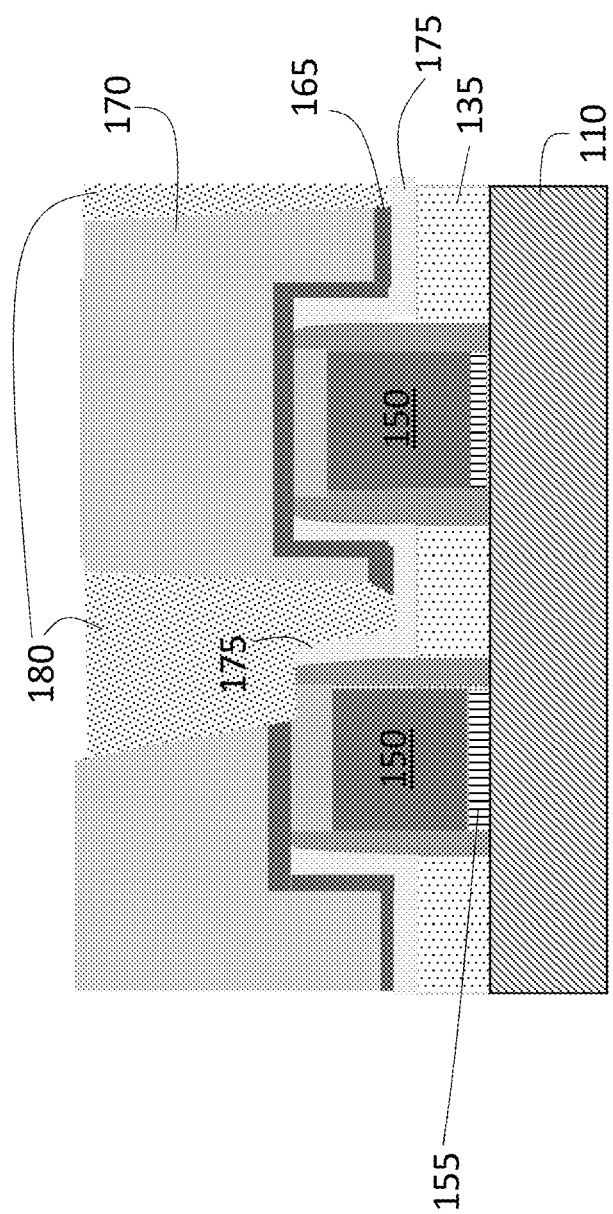

FIG. 11 shows the structure that results from re-deposition of an oxide interlayer dielectric (ILD) 170 followed by SAC RIE to define the contact openings. This RIE process removes exposed portions of the $HfO_2$ layer 165 while leaving the liner 140. FIG. 12 is the structure that results from deposition of the contact metal 180 (e.g., W) in the etched portions of the ILD 170. A high-pressure deuterium anneal (HPD2) at, for example, approximately 400 degrees Celsius for approximately 30 minutes may be performed following the contact metal 180 deposition. This forms silicide 175 (e.g., Ti silicide) from the liner 140 (e.g., Ti). Specifically, based on the silicon in the RSD 135 below the liner 140 and the silicon in the sidewall spacers 130, silicide 175 is formed above the RSD 135 as well as along portions of the sidewall spacers 130 that are above the RSD 135, as shown in FIG. 12. Because of the processes discussed herein that facilitate retaining the liner 140 at both the sidewall of the gate as well as the bottom of the contact, the subsequently formed silicide 175 contact area with the contact metal 180 is increased and contact resistance is further decreased from that of conventional devices.

Figure 13:
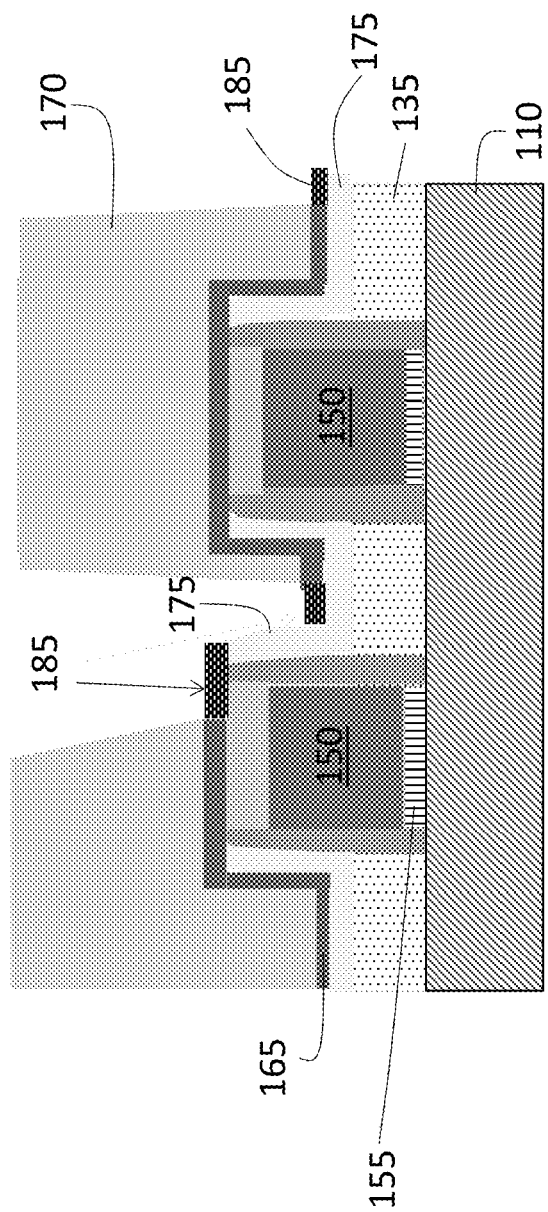
Figure 14:
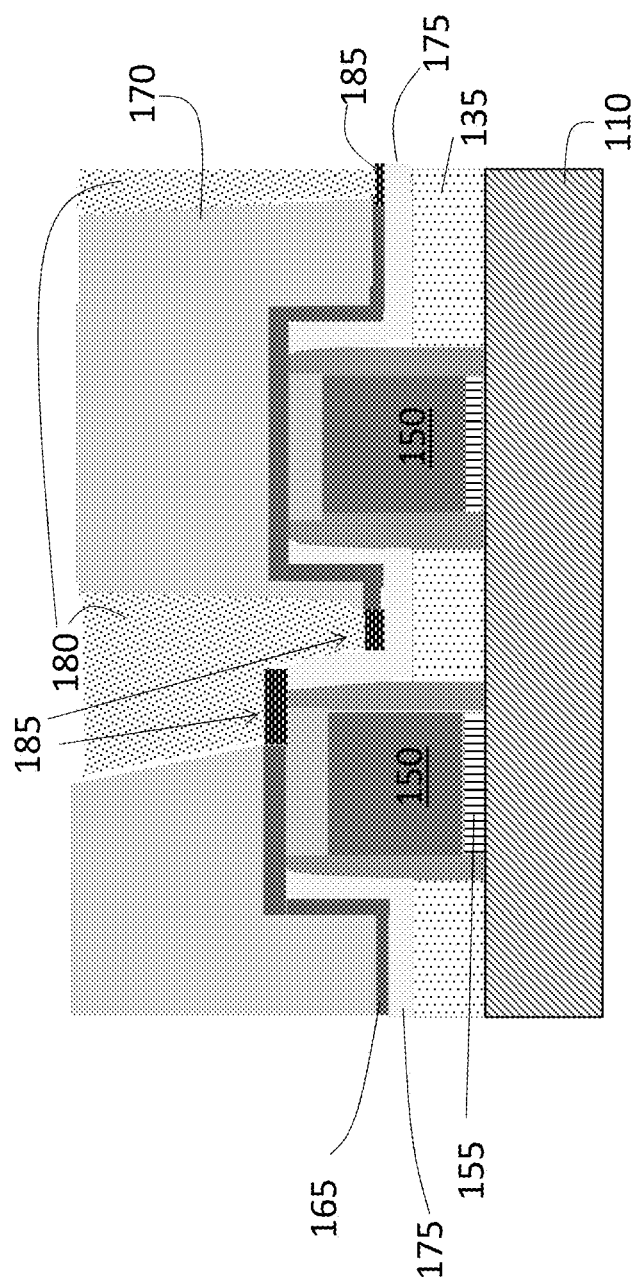

A complimentary metal-oxide-semiconductor (CMOS) device includes complementary and symmetrical pairs of n-type and p-type metal-oxide-semiconductor field effect transistors (MOSFETs). Thus, the finFET device may include pFET and nFET regions. The nFET and pFET regions may be processed in the same way (and as shown in FIGS. 1-12). FIGS. 13 and 14 illustrate additional processes that are specific to the pFET region of the finFET device.

FIG. 13 shows the structure that results from removal of the contact metal 180 from the structure shown in FIG. 12, followed by deposition of a nickel-platinum alloy (NiPt) 185. The NiPt 185 is formed as shown in FIG. 13 according to known processes of patterning using a hard mask layer. The NiPt 185 has a lower contact barrier than the liner 140 (e.g., Ti) and, thus, provides lower resistance in the pFET region. The contact metal 180 is then re-deposited on the NiPt 185. Thus, the finFET device includes an nFET region according to FIG. 12 and a pFET region according to FIG. 14. In an alternate embodiment, rather than as additional processes, the processes of FIGS. 13 and 14 may be performed as alternate processes to those shown in FIGS. 11 and 12 in the pFET region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a fin field effect transistor (finFET) device, the method comprising:

forming a replacement gate stack on a substrate between sidewall spacers, wherein an inside wall of each sidewall spacer contacts the replacement gate stack;

epitaxially growing a raised source drain (RSD) on the substrate adjacent to outside walls of the sidewall spacers, wherein the outside wall of each sidewall spacer is on an opposite side of the respective inside wall of the sidewall spacer;

forming a silicide above the RSD and along the outside walls of the sidewall spacers; and depositing and polishing a contact metal above a portion of the replacement gate stack and the RSD, the depositing including the contact metal contacting the silicide along the outside walls of the sidewall spacers adjacent to the portion of the replacement gate stack.

2. The method according to claim 1, wherein the forming the replacement gate stack includes initially forming a dummy gate stack including a dummy oxide, a dummy gate, and a hard mask layer.

3. The method according to claim 2, further comprising depositing a metal liner conformally on a surface of the RSD, the outside walls of the sidewall spacers, and on a surface of the dummy gate stack.

4. The method according to claim 3, further comprising depositing a flowable oxide on the metal liner and performing a chemical mechanical planarization (CMP) process to remove the metal liner, the hard mask of the dummy gate stack, and the flowable oxide above the dummy gate of the dummy gate stack.

5. The method according to claim 4, further comprising replacing the dummy oxide and dummy gate with the replacement gate stack which includes a high-k dielectric and gate metal, etching back the gate metal, and depositing and polishing a cap material.

6. The method according to claim 5, wherein the forming the silicide includes the metal liner forming a metal-silicide following an anneal process.

7. The method according to claim 1, further comprising depositing an oxide inter layer dielectric (ILD) above other portions of the replacement gate stack and the RSD.

8. The method according to claim 7, further comprising performing a reactive ion etch (RIE) process to remove the oxide ILD above the portions of the replacement gate stack and the RSD.

9. The method according to claim 8, wherein the depositing and polishing the contact metal above the portion of the replacement gate stack and the RSD follows the RIE process to remove the oxide ILD.

10. The method according to claim 1, further comprising forming a nickel platinum (NiPt) layer on the silicide above the RSD and in contact with the portion of the replacement gate stack in a pFET region.

11. The method according to claim 10, wherein the depositing and polishing the contact metal includes the contact metal contacting the silicide along the outside walls of the sidewall spacers adjacent to the portion of the replacement gate stack and contacting the NiPt layer above the portions of the replacement gate stack and the RSD in the pFET region.

12. The method according to claim 1, wherein the depositing and polishing the contact metal includes the contact metal contacting the silicide along the outside walls of the sidewall spacers adjacent to the portion of the replacement gate stack and also above the RSD and contacting the portions of the replacement gate stack in an nFET region.

* * * * *